United States Patent [19]

Arthur et al.

[11] Patent Number: 4,927,772

[45] Date of Patent: May 22, 1990

[54] METHOD OF MAKING HIGH BREAKDOWN VOLTAGE SEMICONDUCTOR DEVICE

[75] Inventors: Stephen D. Arthur, Scotia; Victor A. K. Temple, Jonesville, both of N.Y.

[73] Assignee: General Electric Company, Schenectady, N.Y.

[21] Appl. No.: 358,057

[22] Filed: May 30, 1989

[51] Int. Cl.⁵ .................................. H01L 21/26
[52] U.S. Cl. ............................ 437/6; 437/27; 437/228; 437/933; 437/953; 437/958; 437/148; 437/149
[58] Field of Search .............. 437/6, 27, 228, 933, 437/953, 958, 150, 151, 148, 149; 357/37, 38, 39

[56] References Cited

U.S. PATENT DOCUMENTS

| | | | |
|---|---|---|---|
| 4,374,389 | 2/1983 | Temple et al. | 357/13 |
| 4,648,174 | 3/1987 | Temple et al. | 29/578 |
| 4,825,266 | 4/1989 | Whight | 357/39 |

OTHER PUBLICATIONS

R. Stengl and U. Gösele, "Variation of Lateral Doping—A New Concept to Avoid High Voltage Breakdown of Planar Junctions", Siemens Research Labs., IEDM-85, pp. 154-157.

Primary Examiner—Brian E. Hearn
Assistant Examiner—T. Thomas
Attorney, Agent, or Firm—Marvin Snyder; James C. Davis, Jr.

[57] ABSTRACT

A semiconductor device having at least one P-N junction and a multiple-zone junction termination extension (JTE) region which uniformly merges with the reverse blocking junction is disclosed. The blocking junction is graded into multiple zones of lower concentration dopant adjacent termination to facilitate merging of the JTE to the blocking junction and placing of the JTE at or near the high field point of the blocking junction. Preferably, the JTE region substantially overlaps the graded blocking junction region. A novel device fabrication method is also provided which eliminates the prior art step of separately diffusing the JTE region.

13 Claims, 4 Drawing Sheets

METHOD OF MAKING HIGH BREAKDOWN VOLTAGE SEMICONDUCTOR DEVICE

BACKGROUND OF THE INVENTION

1. Field of the Invention

The present invention relates to semiconductor devices and methods for fabricating same and, more particularly, to a semiconductor device in which a junction termination extension region is utilized to increase the breakdown voltage of the device and to a process for fabricating a semiconductor device including a junction termination extension region.

2. Description of the Prior Art

The maximum reverse voltage that a semiconductor device formed with a P-N junction can withstand is limited by the breakdown voltage of the reverse-blocking junction. The actual breakdown voltage of the junction normally falls short of the breakdown voltage which may ideally be achieved. Such a blocking junction may comprise, for example, a P-N junction of a thyristor, a bipolar transistor, an insulated-gate transistor, or a corresponding junction in a metal-oxide-semiconductor field-effect transistor. Avalanche breakdown occurs in such a device at a voltage substantially less than the ideal breakdown voltage because excessively high electric fields are present at certain locations in the device under reverse bias, i.e., certain 'high field points'. A high field point of a blocking junction under reverse bias usually occurs slightly above the metallurgical junction along a region of curvature, such as that at the end of the junction.

Semiconductor devices of the prior art utilize various structures and methods to achieve an increase in the breakdown voltage of a P-N junction. For example, junction termination extension (JTE) regions are utilized near terminated portions of the P-N junction. In general, a JTE region may be considered as a more lightly doped extension of a heavily doped semiconductor region that adjoins a lightly doped semiconductor region to form the foregoing P-N junction. The principal function of the JTE region is to reduce the high concentration of electric fields that would otherwise exist in the vicinity of the terminated portion of the P-N junction, and especially at the high field points, by laterally extending the blocking junction.

A multiple-zone JTE region and novel fabrication process are described in U.S. Pat. No. 4,648,174, issued to V.A.K. Temple et al. and assigned to the same assignee as the present invention, the entirety of which is incorporated herein by reference. As described therein, a single mask is used to form the multiple-zone JTE region, with the mask having different patterns of openings in different portions thereof. The method described includes forming the single multiple-zone JTE mask on the semiconductor device, and then using the mask to produce the JTE region by implanting and diffusing the JTE dopant in the device. Subsequent to formation of the JTE, a blocking junction mask is formed on the semiconductor device and the blocking junction material is then implanted and diffused. Although more efficient than other prior art JTE fabrication processes, one drawback to this approach, and to all other JTE formation processes, is the difficulty inherent in diffusing the less concentrated JTE implants near the high field points within the more heavily doped region defining the blocking junction. Typically, 30-40 hours at 1150° C. are required for a successful JTE diffusion. If other junctions have been created in the device prior to the JTE fabrication step, they will also be diffused during the JTE drive, sometimes causing deleterious effects.

Another approach to increasing actual breakdown voltage of the P-N junction is to incorporate a low graded junction within the heavily doped region defining the blocking junction. Such an approach is described in detail in an article by R. Stengl and U. Gosele, entitled 'Variation of Lateral Doping — A New Concept to Avoid High voltage Breakdown of Planar Junctions', 1985 *International Electron Devices Meeting*, pp. 154–157. With this technique, a continuous lateral doping gradient is achieved by laterally decreasing the diameter of holes in the implantation mask proximate termination of the reverse-blocking junction. The laterally decreasing diameter holes in the implantation mask act as sources for a drive-in diffusion after implantation. In this process, the heavily doped region defining the blocking junction, including the laterally low graded region adjacent thereto, is simultaneously doped and diffused. Although somewhat less time consuming than the single, multiple zone mask JTE creation process, a significant drawback to this low graded junction approach is the lack of design flexibility inherent in fabricating such a graded junction simultaneous with the heavily doped blocking junction region. Further, with this approach consistent attainment of voltages near ideal breakdown is often impossible because of the difficult nature of the process to implement. For example, the implant concentration for the heavily doped region is typically one or two orders of magnitude greater than that desired for the low graded junction and depending upon the implant process used, e.g., photolithography, it may be impossible to define sufficiently small openings in the mask to attain the desired dopant concentrations within the low graded junction.

Thus, known semiconductor device fabrication methods possess disadvantageous processing limitations and/or fail to consistently result in near ideal device breakdown voltages. Accordingly, a semiconductor device and fabrication method utilizing an improved junction termination extension region which is diffused close to the high field point of the blocking junction with no additional diffusion or diffusion time other than that required for the blocking junction is clearly desirable.

Summary of the Invention

A primary object of the present invention is to provide an improved semiconductor device and fabrication method wherein a junction termination extension region is diffused proximate to the high field point of the blocking junction.

Another object of the invention is to provide such a fabrication method wherein essentially no additional time is required for diffusion of the junction termination extension region than that required for diffusion of the heavily doped blocking junction region.

Still another object of the present invention is to provide a more efficient semiconductor device fabrication method than heretofore known.

Yet another object of the present invention is to provide a semiconductor device having a junction termination extension structure which more consistently and closely produces an ideal reverse blocking junction voltage across the device than heretofore known.

A further object of the present invention is to provide a method for fabricating a semiconductor device which, when complete, includes a junction termination extension region and which in fabrication provides a designer with greater control and flexibility over the reversed biased voltage characteristics of the device than heretofore known fabrication methods.

The foregoing and further objects are realized in accordance with the present invention through provision of a 5 novel semiconductor device termination extension region structure and a novel fabrication method as set forth herein. Briefly, the structure includes a semiconductor device having at least one P-N junction. A first region of semiconductor material is provided of selected conductivity type with a top surface of a predetermined length and a side surface. A second region of semiconductor material with conductivity type opposite that of the first region and extending downward from a portion of the top surface of the first region is also provided. The second region has upper and lower surfaces. The P-N junction is situated at the interface between the first and second regions and a junction termination is formed at the intersection of the P-N junction with the upper surface of the second region. The device has a high field point when reverse biased. The high field point is associated with the P-N junction and is located proximate intersection of the P-N junction with the upper surface of the second region. The novel device structure includes, in combination, a graded region located within the second region adjacent to termination of the P-N junction, and a junction extension region located proximate to the junction termination. The graded region has at least one zone with a lower concentration of dopant than the dopant concentration in the balance of the second region. The junction extension region is of the same conductivity type as the second region and has a greater lateral extent than thickness. The thickness of the junction extension region is close to the distance of the high field point from the upper surface of the second region. A substantial portion of the junction extension region is situated between the junction termination and the side surface of the first region to increase avalanche breakdown voltage of the device. In a preferred form, the junction extension region both overlaps the graded second region and consists of a plurality of zones of different dopant concentrations. A novel method for producing such a structure in part includes: forming a first mask of not so uniform thickness on the semiconductor device adjacent to the terminated portion to be used in forming a junction termination extension region, including configuring the mask to have different patterns of openings exposing different fractions of area of the semiconductor device at different distances from the terminated portion of the reverse-blocking junction, adjacent openings in the mask being configured with a center-to-center spacing of less than one-quarter the ideal depletion width of the reverse biased junction; doping the first region of the semiconductor device through the junction extension mask; forming a second mask of not so uniform thickness on the semiconductor device adjacent the terminated portion and remote from the balance of the junction termination extension region to be used in forming the second region, including the graded region, the second mask forming step including configuring the mask to have different patterns of openings exposing differing fractions of area of the semiconductor device at different distances from the terminated portion of the reverse blocking junction; doping the first region through the second mask with the same concentration of dopant to form the second region and its graded region; and simultaneously diffusing the junction termination extension and second region dopant implants.

Brief Description of the Drawings

The subject matter which is regarded as the invention is particularly pointed out and distinctly claimed in the concluding portion of the specification. The invention, however, both as to organization and method of practice, together with further objects and advantages thereof, can best be understood with reference to the following description taken in conjunction with the accompanying drawings in which:

DETAILED DESCRIPTION OF THE INVENTION

Figure 1:
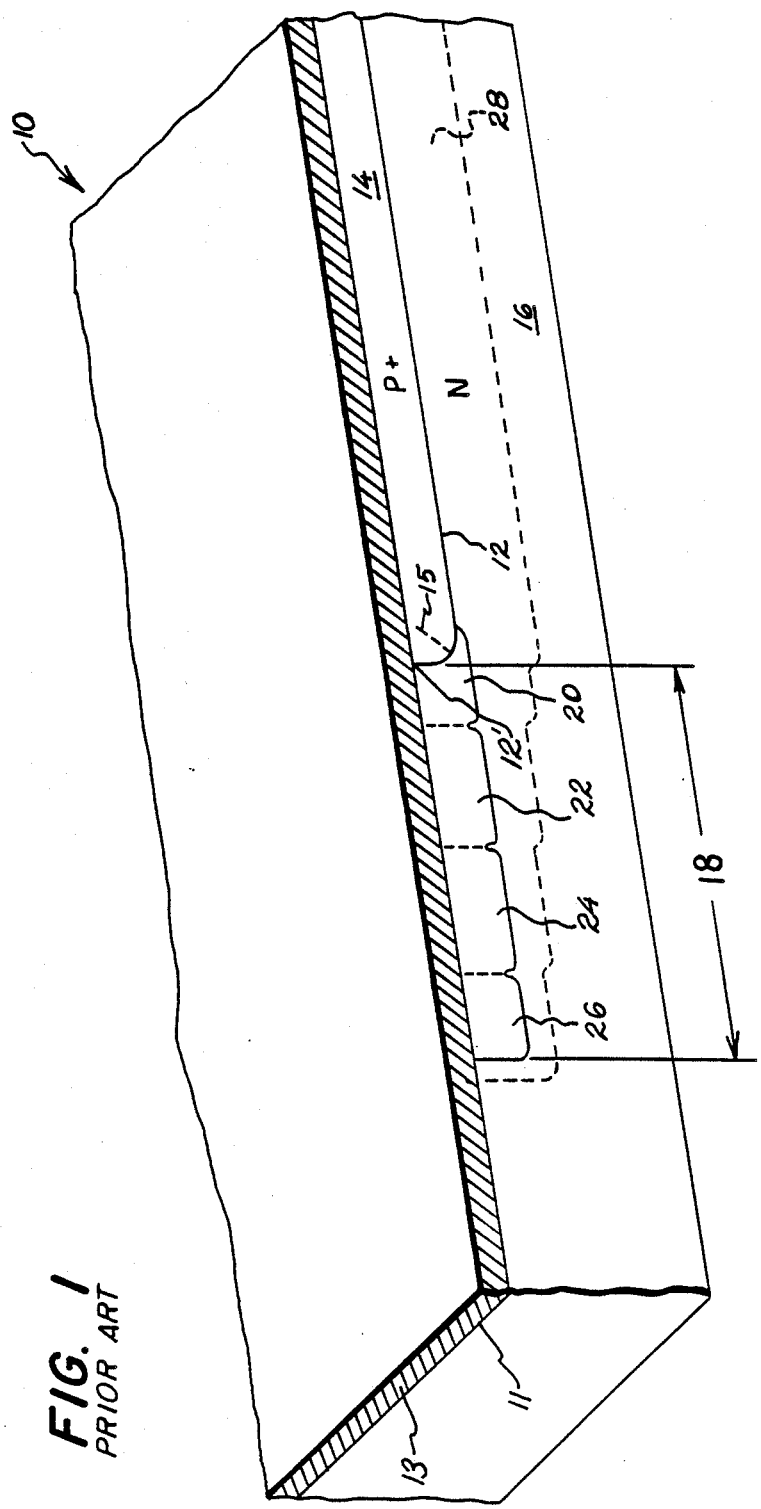
FIG. 1 is a perspective cross-sectional illustration of a portion of a prior art semiconductor device including a reverse blocking P-N junction and a JTE region.

FIG. 1 depicts an upper, left portion of a prior art semiconductor device 10 that includes a P-N junction 12, constituting the interface between a P+region 14 and an N region 16. N region 16 constitutes a voltage-supporting region of device 10 that supports voltage when device 10 is in a reverse-blocking mode. Semiconductor device 10 is shown to have an upper planar surface 11 above which a protective oxide layer 13 has been grown. Alternative configurations for device 10 include non-planar upper surfaces such as exemplified in FIGS. 10-32 of U.S. Pat. No. 4,374,389, of common assignee, the entirety of which is incorporated herein by reference.

Semiconductor device 10 may fail to achieve its ideal breakdown voltage under reverse bias conditions of P-N junction 12 due to excessively high electric fields that are created under reverse bias conditions in the vicinity of terminated portion 12' of P-N junction 12, situated at the upper surface of device 10. Excessive electric fields typically are generated as a 'high field point' located slightly above the metallurgical junction 12 along a region of curvature such as that adjacent terminated portion 12'. Depending upon dopant concentrations, the location of the high field point may vary somewhat, such as along a line 15 shown in phantom.

High electric fields are avoided in the art by the presence of a junction termination extension (JTE) region 18 in semiconductor device 10, which in a common embodiment, includes first, second, third and fourth zones 20, 22, 24, and 26, respectively. Typically, zones 20-26 decrease in dopant concentration or charge per unit area from the first zone 20 to the fourth zone 26. This arrangement of JTE region 18 causes a depletion region 28, surrounding P-N junction 12, to extend from the vicinity of P-N junction 12 all the way to the left of JTE region 18, rather than abruptly terminating near junction termination 12', and thereby resulting in high electric fields near said junction termination. With JTE region 18, it is desired that the various zones 20-26 have a lowermost extent, as viewed in FIG. 1, situated approximately at or below the lowermost extent of P-N junction 12. This limitation is necessitated by the different orders of the magnitude of dopant concentrations in P+region 14 and JTE region 18. The feature is considered instrumental in the prior art in obtaining a desired breakdown voltage for P-N junction 12. If JTE region 18 does not extend below the lowermost extent of P-N junction 12, significant loss in breakdown voltage of P-N junction 12 is experienced.

One novel method for forming JTE region 18 is described in U.S. Pat. No. 4,648,174, of common assignee. This prior art method for fabricating semiconductor device 10 includes in part: forming a single JTE mask over voltage supporting region 16, with the mask configured to have different patterns of openings in different zones thereof; implanting the JTE dopant; diffusing the JTE implant into region 16; forming a P+region mask over voltage supporting region 16; implanting the P+dopant for region 14; and driving in the implanted P+dopant to form region 14 and blocking junction 12. Because the JTE doping requires a relatively small charge (e.g., 2-5e12 charges/cm²) and the blocking junction may be deep (e.g., 10 microns), the diffusion time required to drive the JTE at or below the lowermost extent of P-N junction 12 is long (e.g., 30-40 hours at 1150° C.). During this time, deleterious effects on semiconductor device 10 may be produced, especially if other junctions have been created in the device prior to the JTE fabrication step.

Figure 2:
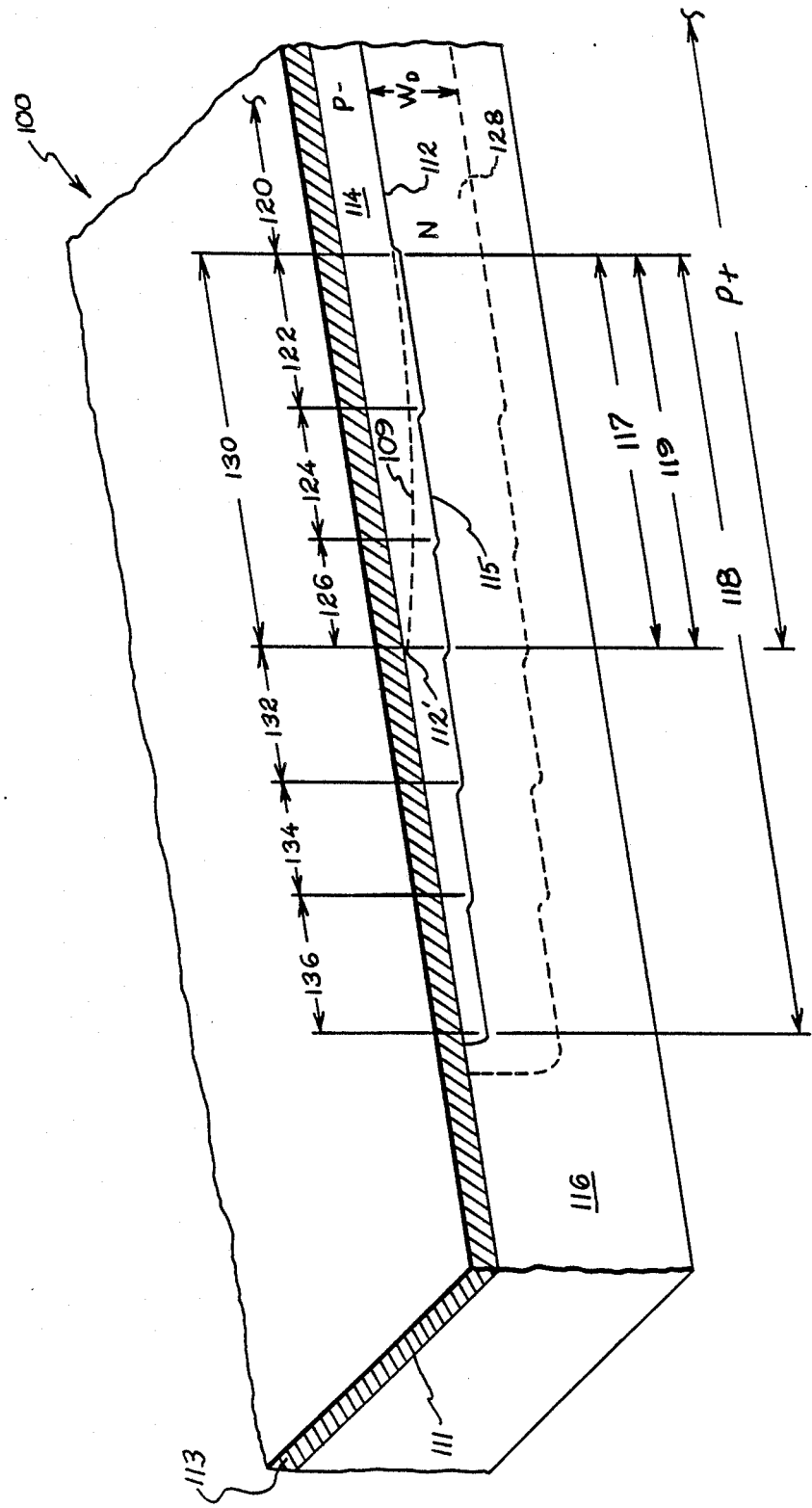
FIG. 2 is a perspective cross-sectional illustration of a portion of a semiconductor device structure in accordance with the present invention.

By comparison to the prior art structure of FIG. 1, one structural embodiment, generally denoted 100, of the present invention is illustrated in perspective, cross-sectional view in FIG. 2. Device 100 includes a P-N junction 112, constituting the interface between a first region 116 of semiconductor material having a selected conductivity type and concentration, herein a lightly or moderately doped N region, and a heavily doped semiconductor second region 114 of conductivity type (P+) opposite that of region 116. N region 116 constitutes a voltage-supporting region of device 100 and supports voltage when device 100 is in a reverse-blocking mode. Although device 100 is shown as having a planar upper surface 111 above which an oxide layer 113 has been grown, alternate configurations for device 100 may be utilized, including the above referenced non-planar upper surfaces.

In an important aspect of the invention, a junction termination extension region 118 is uniformly merged with P-N junction 112 such that an extended, merged P-N junction 115 is defined. This uniform merging is accomplished by grading P+region 114 over a region 117 adjacent terminated portion 112' of P-N junction 112. The lower extent 109 of conventional P-N junction 112 within graded P+region 117 is shown in phantom in FIG. 2. As illustrated, junction termination extension region 118 is preferably formed to overlap a portion of P+region 114, i.e., the area of region 114 within overlap region 119, which in this embodiment is coextensive with graded P+region 117. To ensure good overlap, JTE region 118 may be considered to extend a few microns to the right past graded region 117 over a portion of fully doped P+region 114. Dopant that is introduced into fully doped P+region 114 during the formation of JTE 118 is inconsequential due to the much higher background doping of P+region 114.

The depicted overlap region 119 is considered exemplary and is not intended to limit the scope of the present invention as recited in the appended claims. Indeed, no JTE graded region overlap is believed essential to the invention, however it is preferred. As explained below in connection with applicants' method, in the embodiment illustrated, four zones have been defined within P+region 114. These zones comprise a 100% zone 120, a 75% zone 122, a 50% zone 124 and a 25% zone 126. JTE region 118 similarly comprises four zones, again exemplary, namely, a 100% zone 130, a 75% zone 132, a 50% zone 134 and a 25% zone 136. Those skilled in the art will recognize that the number of zones and the percent doping concentration within each zone of P+region 114 and JTE region 118 can be varied as needed. The specific number of zones and their percent concentration are to be determined for each device based upon desired characteristics. What is important to the present invention, however, is that applicants' structure allows for this significant design flexibility which facilitates the attainment of a desired, near ideal reverse biased breakdown voltage. The invention is applicable to any semiconductor device having a P-N junction or N-P junction wherein the design flexibility and improved reverse-blocking voltage is preferred.

With device 100, it can be observed that the merged blocking junction 115 extends in a substantially uniform manner throughout JTE region 118 before terminating at upper surface 111. (In practice and depending upon dopant concentration levels, the gradations in junction 115 between zones will typically be less pronounced than those illustrated in FIG. 2.)

Gradual merging of dopant concentration within graded region 117 to JTE 118 within overlap region 119 insures that the JTE is located at the high field point of the blocking junction. It is known that the junction depth of a diffusion from a limited source assuming a concentration independent of the diffusivity is given as:

$$X_j = \left\{ 4D_t \mathrm{Ln}\left( \frac{Q}{\sqrt{\pi D_t}\, N_b} \right) \right\}^{\frac{1}{2}}$$

wherein:
$N_b$=background doping concentration
$Q$=integrated dopant concentration
$D_t$=diffusivity-time product
$X_j$=junction depth.

Grading the junction decreases the junction depth $X_j$ as the dopant concentration falls off, as shown in phantom in FIG. 2. In overlap region 119, the total integrated dopant concentration Q comprises the sum of the blocking junction Q and the 100% JTE dopant Q of zone 130. Since the blocking junction TM grading reduces the total integrated doping concentration within region 119 from 100% zone 120 of P+region 114 in a smooth monotonic fashion to 100% JTE zone 130 at terminated portion 112', the blocking junction depth $X_j$ will merge smoothly with the JTE depth providing good proximity of the JTE to the high field point. Within overlap region 119, JTE dopant concentration is on the same order of magnitude as the graded P+region 117 dopant concentration. Thus, because of the uniform merging, the prior art requirement that the lower extent of the JTE be below the vertical extent of the blocking junction is eliminated. As already noted, the location of the high field point depends upon dopant concentration levels within P+ region 114 in the vicinity of terminated portion 112' of junction 112. Because P+ region 114 is graded within region 117, the concentration of junction termination extension region 118 dopant can be lower than the concentration of dopant in P+ region 114 and still the JTE will be at or near the high field point of the junction. Again, those skilled in the art will recognize that various percent zone concentrations within graded region 117 and JTE 118 may be utilized in combination with desired or imposed dopant concentration levels to readily locate the JTE proximate the high field point of junction 112.

Figure 3:
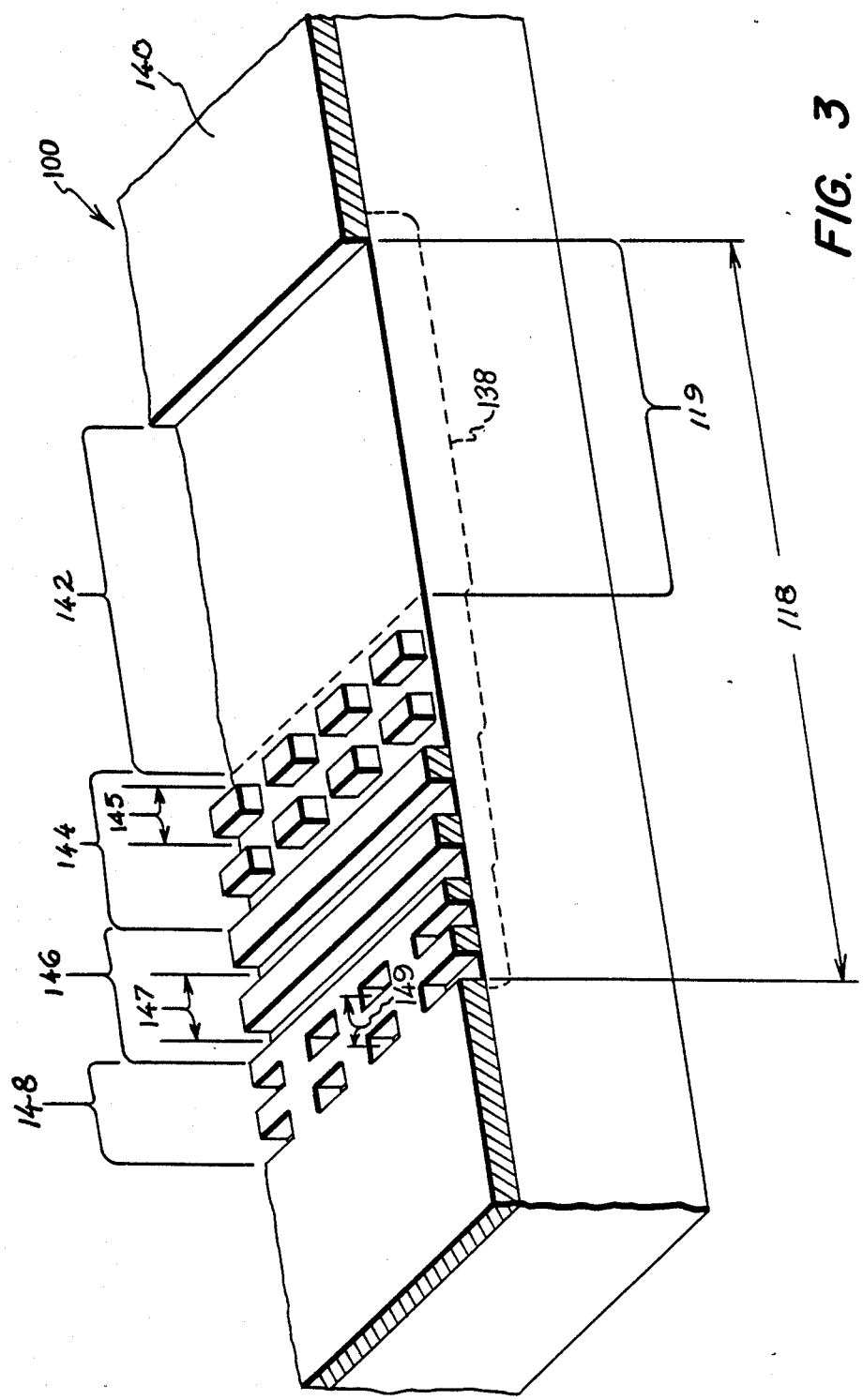
FIG. 3 is a perspective cross-sectional illustration of a portion of a semiconductor device having a first single mask formed and utilized in accordance with the method of the present invention.
Figure 4:
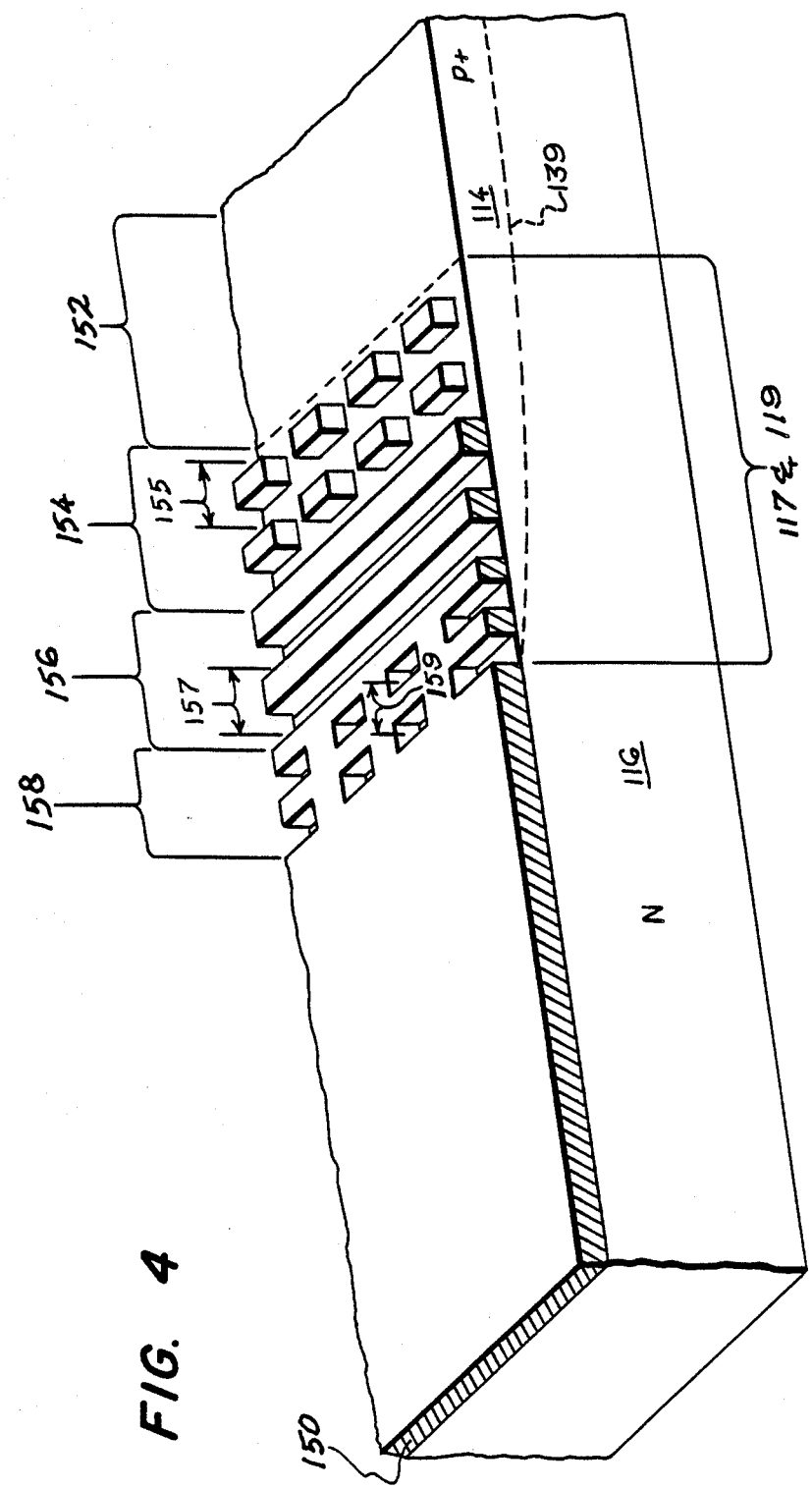
FIG. 4 is a perspective cross-sectional illustration of a portion of a semiconductor device including a second single mask formed and utilized in accordance with the method of the present invention.

The device of FIG. 2 may be produced in accordance with a novel fabrication process which will now be described with reference to FIGS. 3 and 4.

In accordance with the present invention, a first doping mask 140 is formed atop semiconductor device 100, and is used in the formation of JTE region 118. Mask 140 comprises four areas having openings exposing varying percentages of semiconductor material of device 100. These areas constitute first portion 142, second portion 144, third portion 146 and fourth portion 148, and subsequent implantation and diffusion of the JTE implant, result in zones 130-136, respectively. In this embodiment, mask 140 is configured such that portion 142 exposes 100% of the underlying semiconductor material, and portions 144, 146 and 148 expose approximately 75%, 50%, and 25%, respectively. The multistage configuration of mask 140 advantageously permits the formation of multiple-zone JTE region 118 with a single dopant introduction step. In the embodiment illustrated, 100% first mask area 142 extends approximately for the length of overlap region 119. As noted, an alternate number of mask areas and exposure percentages could be utilized if desired. For example, JTE mask 140 could be patterned to expose 100%, 75%, 61.2%, 47.5%, 20% and 6.25% of the semiconductor surface. Further, JTE 118 could include differently graded zones within the region of overlap 119.

The operability of JTE region 118 depends in part upon the center-to-center spacing or adjacent openings in mask portions 144, 146, and 148. Such spacing should be less than approximately 0.25WD, where WD constitutes the width of depletion region 128 in N region 116, beneath P-N junction 112, when P-N junction 112 is reverse biased to its ideal breakdown voltage. More preferably, such center-to-center spacing is less than approximately $0.1W_D$. In second portion 144, the center-to-center spacing of adjacent openings constitutes dimension 145, while in portion 146 such spacing constitutes dimension 147, and in fourth portion 148 such spacing constitutes dimension 149. The resulting nonuniformities in doping (not shown) of JTE regions 132, 134 and 136 due to the patterned openings of mask 140 are negligibly small as long as they are within the foregoing spacing criterion. Undoped areas of semiconductor material could extend all the way to device upper surface 111 without loss of functional capacity of JTE region 118; however, it is preferred that such undoped areas be limited in height as much as feasible. As a further limitation, adjacent openings in mask portions 144, 146, and 148 should not be more than 0.5 to 1.0 dopant diffusion length from each other. Separations greater than this produce islands of charge which are not physically connected to each other in a smooth fashion as is desired.

Mask 140 suitably comprises a conventional photolithographic mask material, such as photoresist, although it alternatively may comprise oxide or metal or other suitable mask material. The illustrated patterns of mask portions 144, 146 and 148 are merely exemplary, and many variations will be apparent to those skilled in the art. The objective is to maintain respective, desired fractional openings in each of mask areas 142-148. By way of example, the portion of mask 140 in second portion 144 may be configured as parallel strips of mask material rather than individual blocks of material as illustrated. After implanting and diffusing the dopant, the JTE would have a lower extent 138 as shown.

In another novel aspect, subsequent implantation of JTE region 118 dopant through mask 140, no drive-in immediately occurs. Rather, a second mask is formed atop semiconductor device 100 for use in forming P+ region 114 and blocking junction 112. By way of example, such a second mask, denoted 150, is illustrated in FIG. 4. Mask 150 also comprises four patterned areas, portions 152-158, having openings exposing different percentages of semiconductor material of device 100. These portions of mask 150, first portion 152, second portion 154, third portion 156 and fourth portion 158, are definitive of graded zones 120-126, respectively, i.e., subsequent implant and diffusion of the P+ dopant. For convenience, portions 152-158 of mask 150 are illustrated to be similar to the first, second, third and fourth mask areas of mask 140. Mask 150 has fractional openings of 100% in first portion 152, 75% in second portion 154, 50% in third portion 156, and 25% in fourth portion 158. The configuration of mask 150 advantageously permits the formation of P+ region 114, including graded region 117, with a single dopant introduction step. Once diffused, the P+ dopant implant would produce a lower extent substantially as shown by phantom line 139. As with JTE mask 140, the center-to-center spacing or adjacent openings in mask areas 154, 156 and 158 of second mask 150 should be less than approximately $0.25W_D$. In second portion 154, the center-to-center spacing of adjacent openings constitutes dimension 155, while in portion 156 such spacing constitutes dimension 157, and in fourth portion 158, such spacing constitutes dimension 159. Because of the presence of overlying JTE zone 130, the limitation that adjacent openings in mask portions of mask 150 not be more than .5 to 1.0 dopant diffusion length is relaxed. Overlying zone 130 serves to electrically connect any islands of charge which would otherwise exist.

As noted above, an important feature of the invention is the design flexibility inherent in the fabrication process. Specifically, with both a graded P+ region 117 and a graded JTE region 118, practically any desired dopant profile can be readily obtained. In addition, chemically different dopants for regions 114 and 118 can be used.

Subsequent to implantation of P+ dopant through second mask 150, an oxide layer 113 is formed on the device and the JTE and the blocking junction implants are diffused simultaneously.

To summarize, one preferred fabrication process of device 100 includes the steps of: forming an oxide layer on the semiconductor material of device 100; patterning the oxide layer for a desired JTE implant; etching holes in the oxide layer where JTE dopant is to be implanted; implanting the JTE dopant; forming a photoresist over the semiconductor material of device 100 and patterning the photoresist for formation of P+ region 114, including graded P+ region 117; implanting P+ dopant for region 114, and graded region 117; removing the photoresist; forming a protective oxide layer over the semiconductor material; and finally, simultaneously diffusing both the JTE implant and the P+ region implant. If desired, the JTE mask formation and implant steps can follow the P+ region mask formation and implant steps. The process advantageously reduces fabrication time by eliminating the separate drive-in previously required for fabrication of the JTE. The P-N junction resulting from drive-in of the semialigned JTE and P+implants pursuant to the invention embodiment described herein is shown in FIG. 2.

The objects of the invention have been described with respect to a specific embodiment, although many modifications and substitutions will occur to those skilled in the art. For example, complementary semiconductor devices could be fabricated in which N-conductivity type semiconductor material is used in lieu of P-conductivity type semiconductor material, and vice versa. Initially, while the masks described herein are taught as being used as dopant masks to form a JTE region and a P-N junction, they could alternatively be used as etchant masks to form a JTE region and a P+ region by selectively removing semiconductor material of an epitaxial layer, for example. It is, therefore, to be understood that the appended claims are intended to encompass all such modification and substitutions as fall within the true spirit and scope of the invention.

What is claimed is:

1. A process of fabricating a semiconductor device including, when complete, at least one P-N junction, a first region of semiconductor material of one conductivity type having an upper surface and forming one side of said junction, a second region of semiconductor material having a lower surface and forming the other side of said junction, said second region being formed within said first region with conductivity type opposite that of the first region; and wherein said P-N junction includes a terminated portion at said upper surface of said first region, said second region includes a graded region adjacent to termination of said P-N junction, and said first region at a location beneath said P-N junction contains a depletion region width $W_D$ when said junction is reverse-biased to its ideal breakdown voltage, the improvement comprising, in combination with the foregoing:

(a) forming a first mask of not so uniform thickness on said semiconductor device adjacent to said terminated portion to be used in forming a junction termination extension region, said step of forming a first mask comprising configuring said mask to expose a percentage x of a first portion of said first region adjacent said terminated portion and to expose a percentage y of a second portion of said first region adjacent said first portion remote from said terminated portion of said P-N junction, and wherein x is greater than y and adjacent openings in said first mask have a center-to center spacing of less than $0.25W_D$;

(b) simultaneously doping said first and second portions of said first region through said first mask with the same concentration of dopant to form in said first region, a first zone contiguous with said terminated portion and a second zone adjacent said first zone, said first and second zones being of approximately the same depth and establishing a junction termination extension;

(c) forming a second mask of not so uniform thickness on said semiconductor device adjacent said terminated portion and remote from the balance of said junction termination extension region, to be used in forming said second region including said graded region, said step of forming a second mask comprising configuring said mask to expose a percentage m of a first portion of said first region adjacent said terminated portion and to expose a percentage n of a second portion of said first region adjacent said first portion remote from said terminated portion of said P-N junction and wherein n is greater than m;

(d) simultaneously doping said first and second portions of said first region through said second mask with the same concentration of dopant to form in said first region said second region such that said second region has a first zone contiguous with said terminated portion and a second zone adjacent said first zone; and (e) simultaneously diffusing said junction termination extension implant and said second region dopant implant, whereby the junction termination extension region is diffused with no additional diffusion time other than that required for diffusion of the P-N junction.

2. The process of claim 1, wherein the separate steps of simultaneously doping said first and second portions of said first region through said first mask and simultaneously doping said first and second portions of said first region through said second mask each comprise introducing dopant of the opposite conductivity type into said first region through openings in said mask.

3. The process of claim 1, wherein said first mask formation step includes forming said first mask of not so uniform thickness over said terminated portion such that said junction termination extension region overlies said terminated portion.

4. The process of claim 1, wherein said first mask forming step (a) includes forming said mask such that adjacent openings in the mask have a center-to-center spacing of less than one diffusion length of the dopant introduced to said first region in step (b).

5. The process of claim 4, wherein said second mask forming step (c) includes configuring said second mask such that adjacent openings in said second mask have a center-to-center spacing of less than $..25W_D..$ 6. The process of claim 5, wherein said second mask forming step (c) includes configuring said second mask such that adjacent openings have a center-to-center spacing of less than or equal to one diffusion length of the dopant implanted to said first region in step (d).

7. The process of claim 3, wherein said first mask formation step further comprises configuring said mask to expose a percentage z of a third portion of said first region, said third portion being adjacent said second portion and more remote from said terminated portion and x is greater than y and y is greater than z.

8. The process of claim 7, wherein said first mask formation step further comprises configuring said first mask to expose a percentage A— of a fourth portion of said first region adjacent said third portion wherein z is greater than A—, said first, second, third and fourth zones of said first region underlying respective portions exposed by said mask each receive a lower dopant dosage per unit device area than any adjacent region more proximate to said second region.

9. The process of claim 8, wherein said percentage x is approximately 100%, said percentage y is approximately 75%, said percentage z is approximately 50%, and said percentage A— is approximately 25%.

10. The process of claim 3, wherein said second mask forming step (c) includes configuring said mask to expose a plurality of different percentages of said first region adjacent said terminated portion through which said simultaneous second mask doping occurs so that a graded second region having a plurality of zones adjacent the junction termination is defined.

11. The process of claim 10, wherein said first mask forming step (a) includes forming said first zone of said first mask to overlie said junction termination and said graded portion of said second region.

12. The process of claim 11, wherein said first mask forming step (a) includes configuring said first mask such that the exposed percentage of said first region through said first zone x is approximately 100%.

13. The process of claim 1, wherein said first mask forming step (a) and simultaneous doping step (b) occur subsequent to said second mask forming step (c) and said simultaneous doping step (d).

* * * * *